US011145366B1

(12) United States Patent
Mantegazza et al.

(10) Patent No.: US 11,145,366 B1
(45) Date of Patent: Oct. 12, 2021

(54) TECHNIQUES TO MITIGATE ERROR DURING A READ OPERATION TO A MEMORY ARRAY

(71) Applicant: Intel Corporation, Santa Clara, CA (US)

(72) Inventors: Davide Mantegazza, Palo Alto, CA (US); Kiran Pangal, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 17 days.

(21) Appl. No.: 16/828,860

(22) Filed: Mar. 24, 2020

(51) Int. Cl.
*G11C 11/00* (2006.01)
*G11C 13/00* (2006.01)
*G11C 29/12* (2006.01)
*G11C 29/50* (2006.01)
*G11C 29/44* (2006.01)

(52) U.S. Cl.
CPC ........ *G11C 13/004* (2013.01); *G11C 13/0004* (2013.01); *G11C 13/0038* (2013.01); *G11C 13/0061* (2013.01); *G11C 29/12005* (2013.01); *G11C 29/44* (2013.01); *G11C 29/50004* (2013.01); *G11C 2213/71* (2013.01)

(58) Field of Classification Search
CPC ............. G11C 13/004; G11C 13/0004; G11C 13/0038; G11C 13/0061; G11C 2213/71; G11C 29/50004
See application file for complete search history.

(56) References Cited

U.S. PATENT DOCUMENTS

| 9,286,975 | B2 * | 3/2016 | Chu | G11C 13/0033 |
| 9,437,293 | B1 * | 9/2016 | Kripanidhi | G11C 13/0069 |
| 9,799,399 | B2 * | 10/2017 | Lee | G06F 3/0604 |
| 10,032,508 | B1 * | 7/2018 | Srinivasan | G11C 13/0061 |
| 2016/0372193 | A1 * | 12/2016 | Kripanidhi | G11C 13/0069 |

* cited by examiner

*Primary Examiner* — Toan K Le
(74) *Attorney, Agent, or Firm* — Compass IP Law PC

(57) ABSTRACT

Examples may include techniques to mitigate errors during a read operation to a memory cell of a memory array. Examples include selecting the memory cell and applying one of multiple demarcation read voltages for respective multiple time intervals to sense a state of a resistive storage element of the memory cell. Examples also include applying a bias voltage to the memory cell following a sense interval to mitigate read disturb to the resistive storage element incurred while the one of the multiple demarcation read voltages was applied to the memory cell.

23 Claims, 12 Drawing Sheets

Circuitry 500

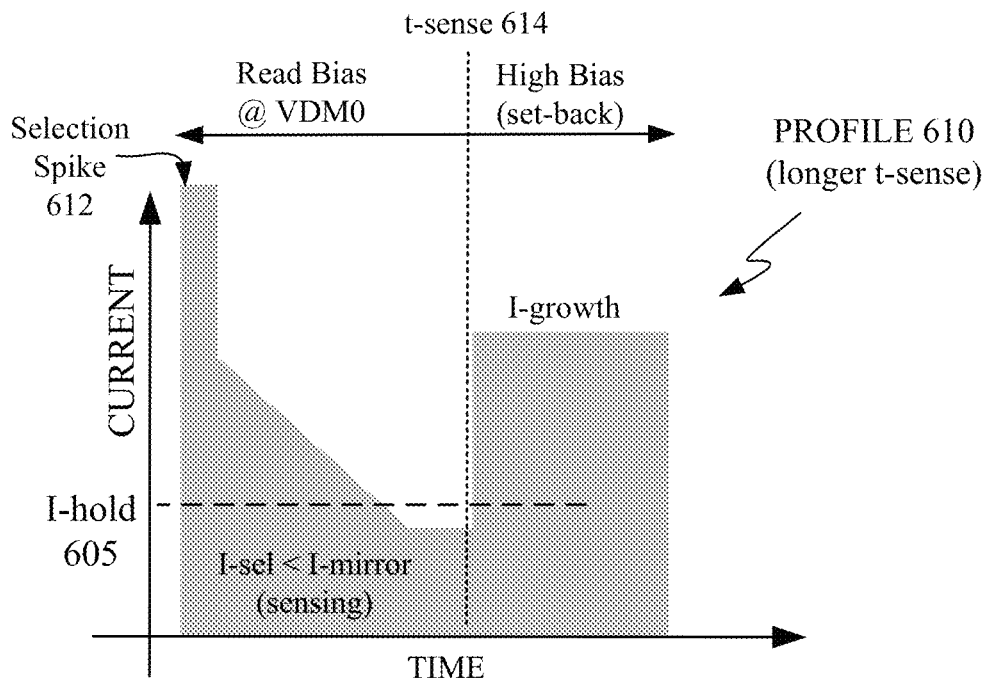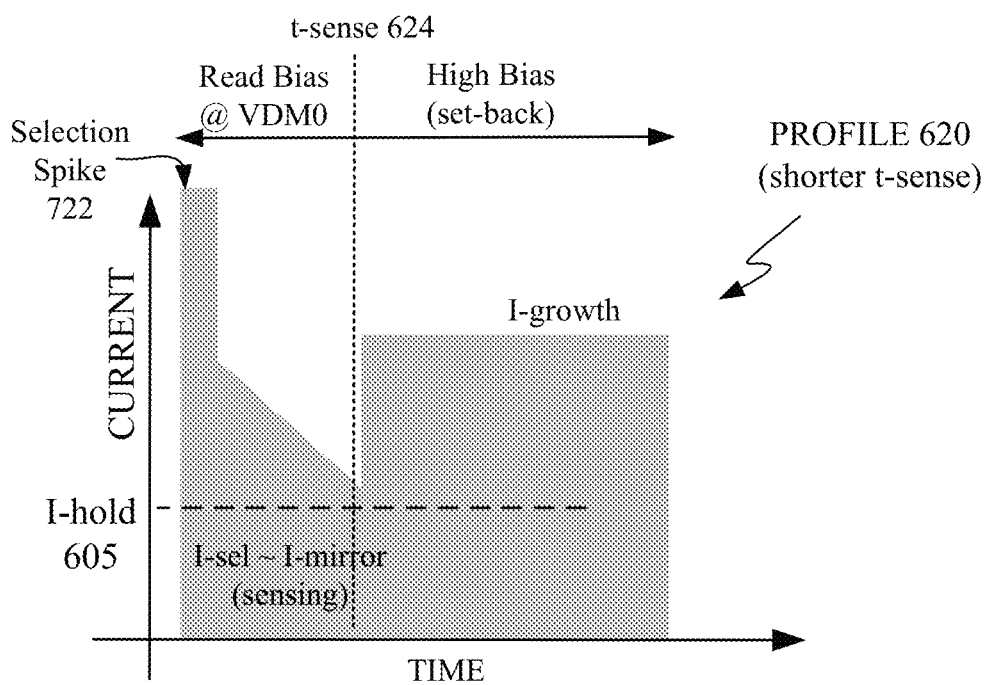
FIG. 6

Read Pulse Profiles 700
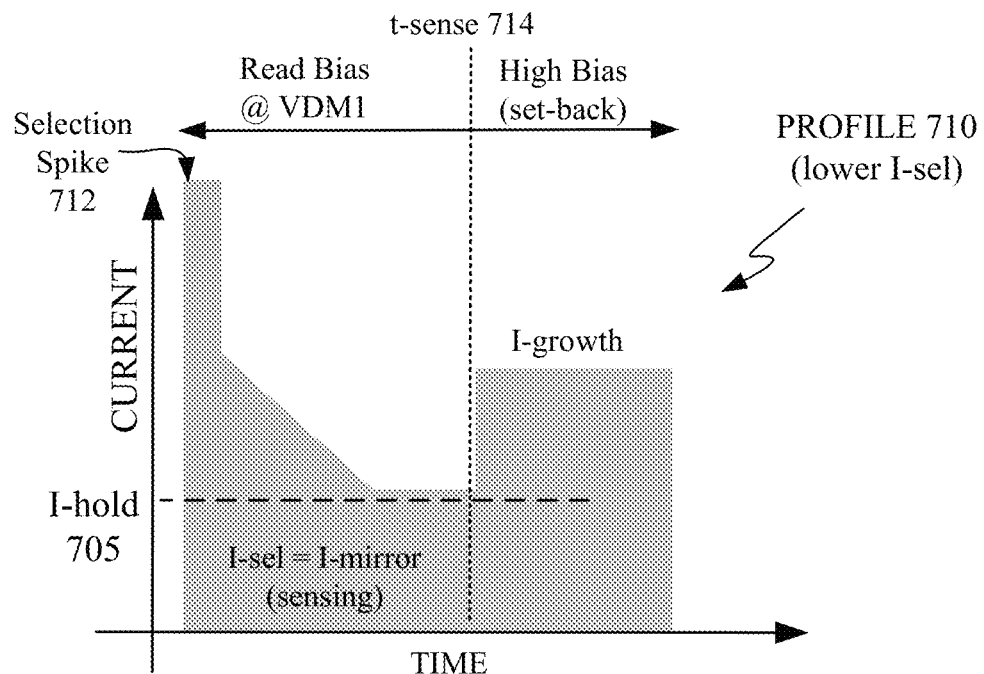
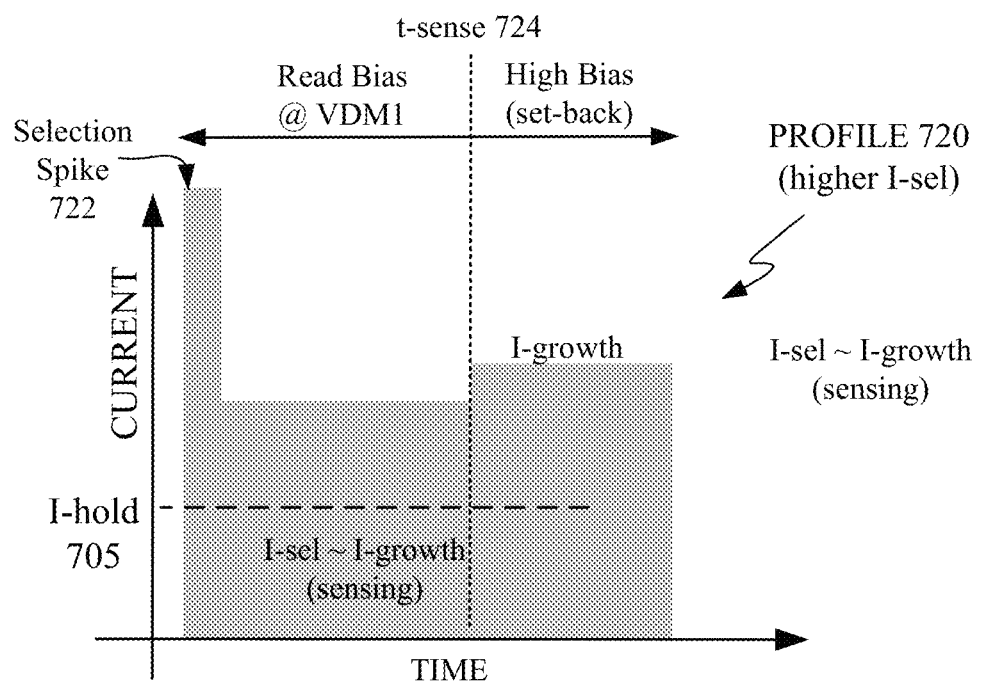
FIG. 7

1000

```
SELECT A MEMORY CELL INCLUDED IN A MEMORY ARRAY
1002
        │
APPLY, TO THE MEMORY CELL, ONE OF A FIRST DEMARCATION READ
VOLTAGE (VDM), A SECOND VDM OR A THIRD VDM FOR A RESPECTIVE
   FIRST, SECOND OR THIRD TIME INTERVAL TO SENSE A STATE OF A
        RESISTIVE STORAGE ELEMENT OF THE MEMORY CELL
                            1004
        │
APPLY, TO THE MEMORY CELL, A BIAS VOLTAGE FOLLOWING THE
RESPECTIVE FIRST, SECOND OR THIRD TIME INTERVAL TO MITIGATE
READ DISTURB TO THE RESISTIVE STORAGE ELEMENT INCURRED
WHILE THE FIRST, SECOND OR THIRD VDM WAS APPLIED TO THE
                   MEMORY CELL
                       1006
```

FIG. 10

Storage Medium 1100

Computer Executable Instructions for 1000

FIG. 11

TECHNIQUES TO MITIGATE ERROR DURING A READ OPERATION TO A MEMORY ARRAY

TECHNICAL FIELD

Examples described herein are generally related to techniques to mitigate errors during a read operation to a memory array included on a memory device.

BACKGROUND

Types of memory such as non-volatile memory may have memory cells that include resistive memory elements that may be capable of storing two or more logic values (e.g., a logic "1" or "0"). A read operation to a memory cell that includes a resistive memory element generally involves applying a current or voltage to a resistive memory element to be read and then detecting an output current or voltage. An amplitude of the detected output current or voltage is then used to determine a state of a the resistive memory element. The state, for example, may be a "SET" state having a logical value of "1" or a "RESET" state having a logical value of "0". A threshold amplitude used to distinguish a state of a resistive memory element is commonly referred to as a read reference current or voltage. Typically, a single value for a read reference current or voltage is used to determine the state of the resistive memory element.

BRIEF DESCRIPTION OF THE DRAWINGS

FIG. 6 illustrates an example first current profile during a read operation.
FIG. 7 illustrates an example second current profile during a read operation.
FIG. 10 illustrates an example of a logic flow.
FIG. 11 illustrates an example of a storage medium.

DETAILED DESCRIPTION

Figure 1:
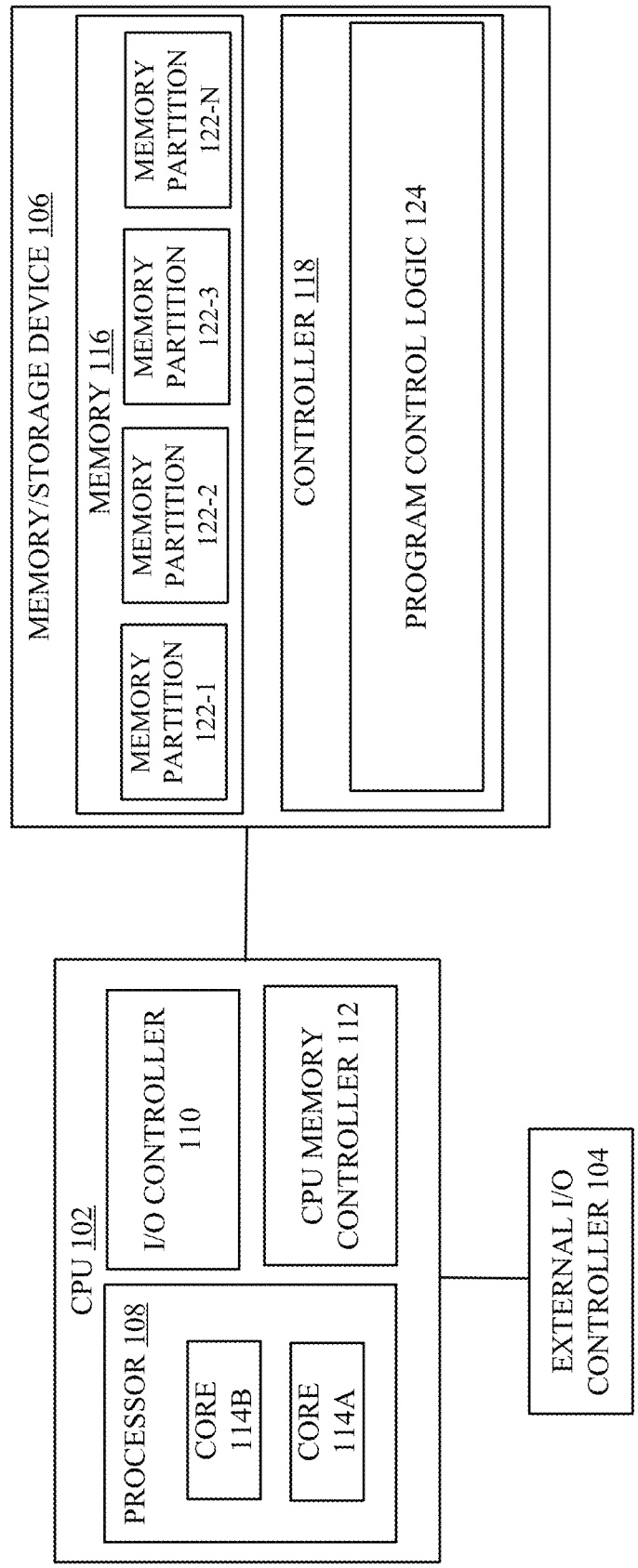
FIG. 1 illustrates an example system.

As mentioned above, a read reference current or voltage is used as a threshold amplitude to distinguish a state of a resistive memory element and a single read reference current or voltage is typically used during a read operation. In some examples, the memory array may include memory cells arranged in a single level memory array or in a multi-level or 3-dimensional (3D) memory array. An example of a type of 3D memory array may be a 3D cross-point memory structure. A memory cell of a single level or 3D memory array may include a resistive memory element capable of storing data (e.g., logic levels) that may be accessed when voltages or current are applied to a word line (WL) and a bit line (BL) coupled to the memory cell. A memory cell is referred to as being "selected" by applying a bias voltage or current to a cross-point of a WL and BL coupled to the selected memory cell.

In some examples, a read operation for a 3D cross-point memory structure may be used to differentiate between programmed states of a selected memory cell included in the 3D cross-point memory structure. For these examples, a bias voltage referred to as a demarcation read voltage "VDM" may be applied across WL and BL terminals of the selected memory cell. In response to this bias voltage being applied, the memory cell may go into a conductive ON state (state1 or SET) or may remain in a weakly conductive OFF state (state0 or RESET). Next generation 3D cross-point memory structures such as phase change memory 3D cross-point memory structures may include increasing numbers and/or densities of memory cells that result in path resistance increases across WL and BL terminals for selected memory cells. These resistance increases may cause a hold current (I-hold) problem that may lead to an inability to keep a selected memory cell in a conduction ON state during a read operation. For example, a maximum current that can be delivered during a read operation drops below I-hold due to higher resistance and a memory cell that was programmed to state1 (SET) may erroneously be read as being in state0 (RESET). The incorrectly read state of the memory cell may then lead to a bit error for reading data stored to a memory array.

Another common problem to be addressed with phase change memory 3D cross-point memory structures is mitigating read disturb of a storage element of a selected memory cell. Read disturb may be a result of the storage element of the selected memory cell programmed to maintain a SET state being weakly programmed or disturbed due to a snap-back discharge effect that occurs during a read operation. The resulting read disturb may be mitigated by reducing cell capacitance during the read operation of the selected memory cell to limit current through the storage element during the read operation. The current limited for a relatively short period of time to minimize cell heating. Also, a short set-back operation after the snap-back discharge may mitigate the read disturb effect on the storage element of the memory cell. This typically involves use of a higher bias voltage to generate a growth current (I-growth) to set-back the storage element to the SET state.

Examples described in this disclosure include techniques to mitigate potential I-hold or read disturb problems for read operations to memory cells of a memory array by using multiple read reference currents or voltages that depend, in some examples, on whether a previous write and/or read operation to a selected memory cell has occurred within a time interval or depends on whether the selected memory cell is undergoing a retry-read operation.

FIG. 1 illustrates an example system 100. In some examples, as shown in FIG. 1, system 100 includes a central processing unit (CPU) 102 coupled to an external input/output (I/O) controller 104 or a memory/storage device 106. During operation, data may be transferred between memory/storage device 106 and CPU 102. In various examples, particular memory access operations (e.g., read and write operations) involving memory/storage device 106 may be issued by an operating system and/or other software applications executed by a processor 108 of CPU 102. In various examples, memory/storage device 106 may include memory 116. Also, as shown in FIG. 1, memory 116 may include memory partitions 122-1 to 122-N, where "N" represents any positive whole integer >3.

According to some examples, processor 108 of CPU 102 may be a microprocessor, an embedded processor, a DSP, a network processor, a handheld processor, an application processor, a co-processor, an SOC, or other device to execute code (i.e., software instructions). Processor 108, as shown in FIG. 1, may include two processing elements such as, but not limited to, cores 114A and 114B. Cores 114A/B may include asymmetric processing elements or symmetric processing elements. However, a processor such as processor 108 may include any number of processing elements that may be symmetric or asymmetric. In some examples, CPU 102 may be referred to as a host computing device (though a host computing device may be any suitable computing device operable to issue memory access commands to memory/storage device 106).

In some examples, a processing element (e.g., such as cores 114A/B) may refer to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in some examples, may refer to any hardware capable of being independently associated with code, such as a software thread, operating system, application, or other code. A physical processor (or processor socket) typically refers to an integrated circuit, which potentially includes any number of other processing elements, such as cores or hardware threads.

In some examples, a core of a processor (e.g., core 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. In some examples, when certain resources are shared and others are dedicated to an architectural state, the line between the nomenclature of a hardware thread and core may overlap. Yet often, a core and a hardware thread are viewed by an operating system as individual logical processors, where the operating system is able to individually schedule operations on each logical processor.

According to some examples, although not shown in FIG. 1, processing elements may also include one or more arithmetic logic units (ALUs), floating point units (FPUs), caches, instruction pipelines, interrupt handling hardware, registers, or other hardware to facilitate the operations of the processing elements.

According to some examples, an input/output (I/O) controller 110 of CPU 102 may be arranged as an integrated I/O controller that includes logic for communicating data between CPU 102 and I/O devices, which may refer to any suitable logic capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In some examples, an I/O device may comprise controller 118 of memory/storage device 106 coupled to the CPU 102 through I/O controller 110.

In some examples, an I/O device may communicate with I/O controller 110 of CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) specification and/or Advanced Host Controller Interface (AHCI) (e.g., as described by one or more AHCI specifications such as Serial ATA AHCI: Specification, Rev. 1.3.1). I/O devices coupled to the I/O controller may be located off-chip (i.e., not on the same chip as CPU 102) or may be integrated on the same chip as the CPU 102.

According to some examples, a CPU memory controller 112 of CPU 102 may be arranged as an integrated memory controller that includes logic to control the flow of data going to and from one or more system memory devices that may include, but are not limited to memory/storage device 106. For example, CPU memory controller 112 may include logic operable to read from memory/storage device 106, write to memory/storage device 106, or to request other operations from memory/storage device 106. In some examples, CPU memory controller 112 may receive write requests from cores 114 and/or I/O controller 110 and may provide data specified in these requests to memory/storage device 106 for storage therein. CPU memory controller 112 may also read data from memory/storage device 106 and provide the read data to I/O controller 110 or a core of processor 108. During operation, CPU memory controller 112 may issue commands including one or more addresses of memory/storage device 106 in order to read data from or write data to memory (or to perform other operations). In some examples, CPU memory controller 112 may be implemented on the same chip as CPU 102, whereas in other embodiments, CPU memory controller 112 may be implemented on a different chip than that of CPU 102. I/O controller 110 may perform similar operations with respect to one or more memory/storage devices 106.

In some examples, CPU 102 may also be coupled to one or more other I/O devices through an external I/O controller 104. For example, external I/O controller 104 may couple a memory or storage device such as memory/storage device 106 to CPU 102. External I/O controller 104 may include logic to manage the flow of data between one or more CPUs 102 and I/O devices. For example, external I/O controller 104 is located on a motherboard along with the CPU 102. For this example, external I/O controller 104 may exchange information with components of CPU 102 using point-to-point or other interfaces.

According to some examples, memory/storage device 106 may store any suitable data, such as data used by processor 108 to provide the functionality of system 100. For example, data associated with programs that are executed or files accessed by cores 114 may be stored in memory/storage device 106. Thus, memory/storage device 106 may be capable of functioning as a system memory that stores data and/or sequences of instructions that are executed or otherwise used by the cores 114. In various embodiments, memory/storage device 106 may store persistent data (e.g., a user's files or instruction sequences) that maintains its state even after power to memory/storage device 106 is removed. Memory/storage device 106 may be dedicated to a particular CPU 102 or shared with other devices (e.g., one or more other processors or other device) of system 100.

In some examples, memory 116 of memory/storage device 106 may include non-volatile memory and/or volatile memory. Non-volatile memory may be a storage medium that does not require power to maintain the state of data stored by the medium. Nonlimiting examples of nonvolatile memory may include any or a combination of: planar or 3D NAND flash memory or NOR flash memory, 3D cross-point memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), resistive RAM, other various types of non-volatile random access memories (RAMs), and/or magnetic storage memory. Volatile memory is a storage medium that requires power to maintain the state of data stored by the medium. Nonlimiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In some embodiments, any portion of memory 116 that is volatile memory can comply with JEDEC standards including but not limited to Double Data Rate (DDR) standards, e.g., DDR3, 4, and 5, or Low Power DDR4 (LPDDR4) as well as emerging standards.

According to some examples, memory/storage device 106 may also store any suitable data, such as data used by processor 108 to provide functionality of system 100. For example, data associated with programs that are executed or files accessed by cores 114A and 114B may be stored in memory/storage device 106. At least a portion of memory/storage device 106 may be arranged to store persistent data (e.g., a user's files or software application code) that maintains its state even after power to the memory/storage device 106 is removed. In some examples, memory/storage device 106 may be dedicated to CPU 102 or shared with other devices (e.g., another CPU or other device) of system 100.

In some examples, as shown in FIG. 1, memory/storage device 106 includes a controller 118 and memory 116 having memory partitions 122-1 to 122-N. For these examples, memory partitions 122-1 to 122-N may be operable or arranged to store data, however, a memory/storage device such as memory/storage device 106 may include any suitable number of memory partitions. In some examples, a memory partition from among memory partitions 122-1 to 122-N may include a plurality of memory cells that are each operable to store one or more bits. Memory cells of a memory partition 122 may be arranged in any suitable fashion, such as in rows (e.g., wordlines) and columns (e.g., bitlines), three dimensional structures, sectors, or other manner. Memory cells may be logically grouped into banks, blocks, subblocks, wordlines, pages, frames, bytes, or other suitable groups. A given memory partition 122 may include any of the volatile or non-volatile memories listed above or other suitable memory. For example, each memory partition 122 may include one or more 3D cross-point memory arrays. 3D cross-point memory cell structures for 3D cross-point memory arrays are described in more details below.

In various examples, memory/storage device 106 may be a solid state drive; a memory card; a Universal Serial Bus (USB) drive; a Non-Volatile Dual In-line Memory Module (NVDIMM); storage integrated within a device such as a smartphone, camera, or media player; or other suitable system memory and/or mass storage device. In some examples, memory partitions 122-1 to 122-N may include non-volatile memory or a combination of volatile and non-volatile types of memory.

According to some examples, memory 116 may be included in a semiconductor package. A semiconductor package may include a casing having one or more semiconductor dies (also referred to as chips). A semiconductor package may also include contact pins or leads used to connect to external circuits. In some examples, memory partitions 122-1 to 122-N may be separately embodied on their own respective dies. Accordingly, for these examples, memory 116 may be incorporated in a semiconductor package that includes a plurality of dies that separately include a memory partition 122. However, a semiconductor package may merely be one example of a form memory 116 may take as memory included in memory/storage device 106. For example, although a single physical package may include a single die, multiple dice of memory 116 may be resident on a single semiconductor package or multiple dies of memory 116 may be spread across multiple semiconductor packages. As another example, memory 116 may be embodied in one or more different physical mediums, such as a circuit board, die, disk drive, other medium, or any combination of thereof (or combination with one or more packages). In other examples, a single die of memory 116 may include multiple memory partitions 122 (e.g., all or a portion of the memory partitions 122 of memory 116). As another example, a memory partition from among memory partitions 122-1 to 122-N may be embodied in one or more different physical mediums, such as a circuit board, package, disk drive, other medium, or any combination thereof (or in combination with one or more dies).

In some examples, memory/storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. Memory storage device 106 may also include a communication interface to communicate with CPU memory controller 112 or I/O controller 110 in accordance with any suitable logical device interface specification such as NVMe, AHCI, or other suitable specification. In some examples, memory/storage device 106 may include multiple communication interfaces that may each communicate using a separate protocol with CPU memory controller 112 and/or I/O controller 110.

According to some examples, controller 118 of memory/storage device 106 may include logic to receive requests from CPU 102 (e.g., via CPU memory controller 112 or I/O controller 110), cause the requests to be carried out with respect to memory 116, and provide data associated with the requests to CPU 102 (e.g., via CPU memory controller 112 or I/O controller 110). Controller 118 may also be operable to detect and/or correct errors encountered during a memory operation. In some examples, controller 118 also tracks a number of times particular cells (or logical groupings of memory cells) have been written to in order to perform wear leveling and/or to detect when memory cells are nearing an estimated number of times they may be reliably written to. In performing wear leveling, controller 118 may evenly spread out write operations among blocks of the memory of memory 116 such that particular blocks are not written to more than other blocks. Controller 118 may also track relative timing of read and/or write operations to determine an elapsed time between a current read and/or write operation to a memory cell and a previous read and/or write operation to the memory cell. Controller 118 may also monitor various characteristics of memory/storage device 106 such as the temperature or voltage and report associated statistics to CPU 102. Controller 118 may be implemented on a same circuit board or device as memory 116 or on a different circuit board, or device. For example, in some implementations, controller 118 may be a centralized controller managing memory operations for multiple different memory 116 (which could each be of the same type of memory or could be of different types) of system 100 (and thus could provide controller functionality described herein to any of the memories to which it is coupled).

In some examples, controller 118 also includes program control logic 124 which may be operable to control the programming sequence performed when data is written to or read from memory 116. Program control logic 124 may provide various voltages (or information indicating which voltages should be provided) that are applied to memory cells during a write and/or read operation (or perform other operations initiating data reads or writes), perform error correction, and perform other suitable functions.

According to some examples, program control logic 124 may be integrated on a same chip as controller 118 or on a different chip. As shown in FIG. 1, in some examples, program control logic 124 is part of controller 118, although in other examples, all or a portion of the program control logic 124 may be separate from controller 118 and communicably coupled to controller 118. For example, all or a portion of the program control logic 124 may be located on the same package or chip as memory 116.

In some examples, all or some of the elements of system 100 are resident on (or coupled to) the same circuit board (e.g., a motherboard). In various examples, any suitable partitioning between the elements may exist. For example, the elements depicted in CPU 102 may be located on a single die (i.e., on-chip) or package or any of the elements of CPU 102 may be located off-chip or off-package. Similarly, the elements depicted in memory/storage device 106 may be located on a single chip or on multiple chips. In various examples, memory/storage device 106 and a computing host (e.g., CPU 102) may be located on a same circuit board or on a same device and in other examples memory/storage device 106 and the computing host may be located on different circuit boards or devices.

According to some examples, components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various examples, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various examples, components of computer system 100 may be coupled together through one or more networks comprising any number of intervening network nodes, such as routers, switches, or other computing devices. For example, a computing host (e.g., CPU 102) and memory/storage device 106 may be communicably coupled through a network.

Although not depicted, system 100 may use a battery and/or power supply outlet connector and associated system to receive power, a display to output data provided by CPU 102, or a network interface allowing CPU 102 to communicate over a network. In various embodiments, the battery, power supply outlet connector, display, and/or network interface may be communicatively coupled to CPU 102. Other sources of power may be used such as renewable energy (e.g., solar power or motion based power).

Figure 2:
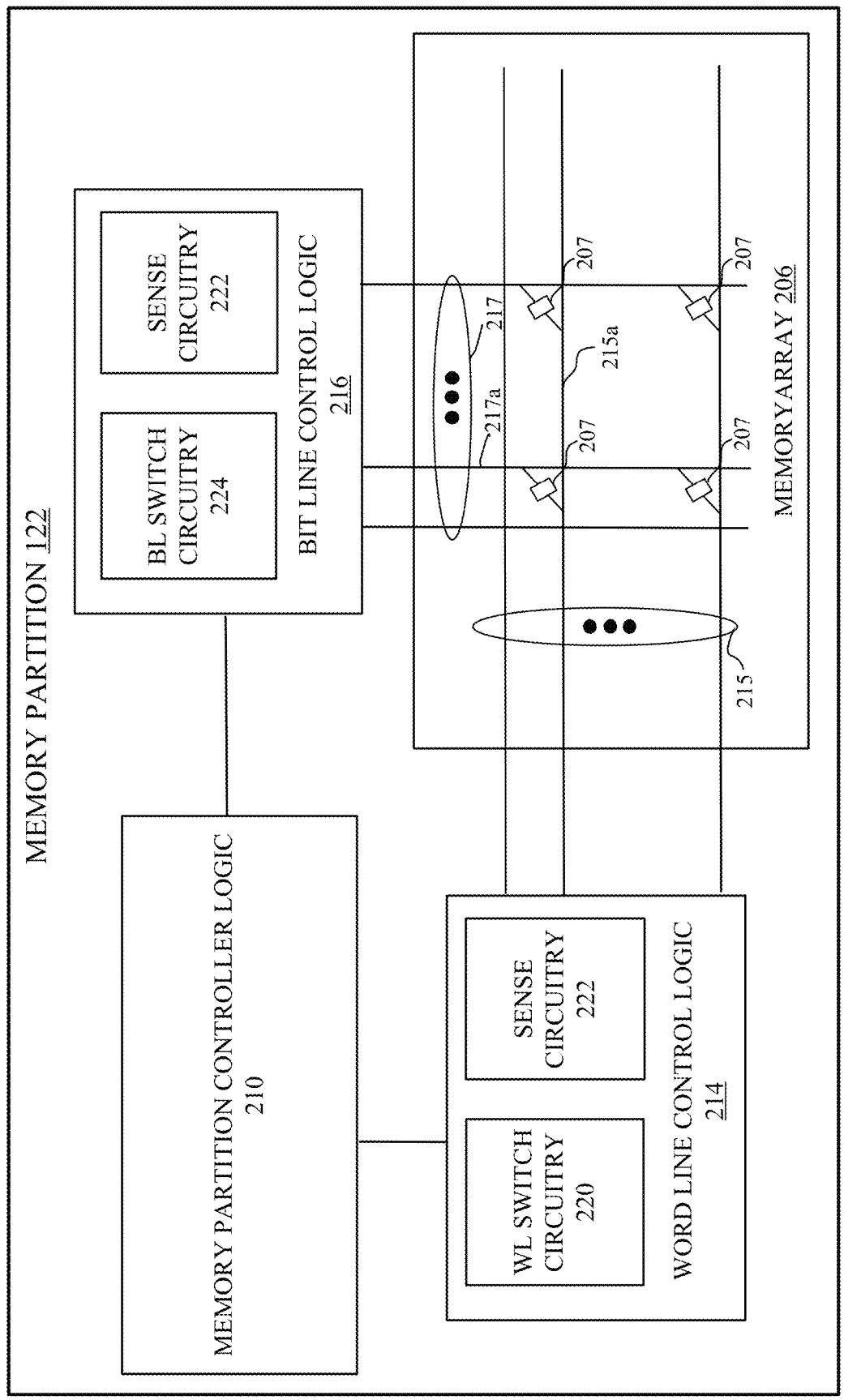
FIG. 2 illustrates an example memory partition.

FIG. 2 illustrates further details of memory partition 122 of memory 116. In some examples, memory partition 122 may include a 3D cross-point memory array having 3D cross-point memory cells that include phase change memory, resistive RAM, or other types of resistive memory. Memory cells of types of phase change memory typically use a chalcogenide material as a type of storage element. In operation, the storage element may store information by changing the phase of the storage element between amorphous and crystalline phases. The chalcogenide material of the storage element may exhibit either a crystalline or an amorphous phase that exhibit a respective high or low conductivity. Generally, the amorphous phase has a low conductivity (high impedance) and is associated with a RESET state (logic zero) and the crystalline phase has a high conductivity (low impedance) and is associated with a SET state (logic one). The storage element may part of a 3D cross-point memory cell that also includes a selector, i.e., a select device coupled to the storage element. Select devices of multiple 3D cross-point memory cells may be configured to facilitate combining a plurality of storage elements the multiple cross-point memory cells into a 3D cross-point memory array.

According to some examples, a 3D cross-point memory array may include a transistor-less (i.e., at least with respect to storage elements of the memory) stackable cross-point architecture in which memory cells sit at the intersection of row address lines and column address lines arranged in a grid. The row address lines and column address lines, called word lines (WLs) and bit lines (BLs), respectively, cross in the formation of the grid and each memory cell is coupled between a WL and a BL where the WL and BL cross. At the point of a crossing, the WL and BL may be located at different vertical planes such that the WL crosses over or below the BL but does not physically touch the BL. As described above, the architecture may be stackable, such that a word line may cross over a bit line located beneath the word line and another bit line located above the word line. It should be noted that row and column are terms of convenience used to provide a qualitative description of the arrangement of WLs and BLs in cross-point memory. In various examples, memory cells of a 3D cross-point memory array may be individually addressable. In some examples, bit storage may be based on a change in bulk resistance of a storage element included in a 3D cross-point memory cell.

During a programming operation (e.g., a write operation), a phase of a storage element of a 3D cross-point memory cell may be changed by application of a first bias voltage to a WL and a second bias voltage to a BL resulting in a differential bias voltage across the 3D cross-point memory cell that may cause a current to flow through the storage element. Differential bias voltage may be maintained across the 3D cross-point memory cell for a first time period sufficient to cause the storage element to "snap-back" and then maintained for a second time period to transition the storage element from an amorphous state to a crystalline state or from a crystalline state to an amorphous state (e.g., via the application of heat produced by an electric current). Snap-back is a property of the composite storage element that results in an abrupt change in conductivity and an associated abrupt change in the voltage across the storage element.

In some examples, during a read operation, a target 3D cross-point memory cell is selected via the application of a first bias voltage to the WL and a second bias voltage to the BL that cross at the target 3D cross-point memory cell for a time interval. A resulting differential bias voltage across the storage element of the 3D cross-point memory cell is configured to be greater than a maximum SET voltage and less than a minimum RESET voltage for the storage element. In response, the storage element of the targeted/selected 3D cross-point memory cell may or may not snap-back, depending on whether the storage element is in the crystalline state (SET) or the amorphous state (RESET). Sense circuitry, coupled to the storage element, may be configured to detect the presence or absence of snap-back in a sensing time interval (t-sense). A presence of snap-back may then be interpreted as a logic one (SET) and the absence of snap back as a logic zero (RESET).

In some examples, as shown in FIG. 2, memory partition 122 includes a memory partition controller logic 210, a word line control logic 214, a bit line control logic 216, and memory array 206. A host device (e.g., CPU 102) may provide read and/or write requests including memory address(es) and/or associated data to memory partition 122 (via controller 118) and may receive read data from memory partition 122 (via controller 118). Memory partition controller logic 210 (in conjunction with word line control logic 214 and bit line control logic 216) may be configured to perform memory access operations, e.g., reading a target memory cell and/or writing to a targeted or selected memory cell.

According to some examples, memory array 206 may represent at least a portion of a 3D cross-point memory array (e.g., that may include phase change memory) and includes a plurality of word lines 215, a plurality of bit lines 217 and a plurality of memory cells, e.g., memory cell 207. Each memory cell is coupled between a word line ("WL") and a bit line ("BL") at a cross-point of the WL and the BL. Each memory cell includes a memory or storage element configured to store information and may include a memory cell select device (i.e., selector) coupled to the storage element (not shown). Select devices may include ovonic threshold switches, diodes, bipolar junction transistors, field-effect transistors, etc. Memory array 206 may be configured to store binary data and may be written to (i.e., programmed) or read from.

In some examples, memory partition controller logic 210 may manage communications with controller 118 of memory/storage device 106. In one example, memory partition controller logic 210 may analyze one or more signals received from controller 118 to determine whether a command sent via a bus is to be consumed by the memory partition 122. For example, memory partition controller logic 210 may analyze an address of the command and/or the value on an enable signal line coupled to controller 118. Memory partition controller logic 210 may be configured to identify one or more target WLs associated with a received memory address (this memory address may be a separate address from the memory partition address that identifies the memory partition 122, although a portion of an address field of a command may identify the memory partition while another portion of the address field may identify one or more WLs). Memory partition controller logic 210 may be configured to manage operations of WL control logic 214 and BL control logic 216 based, at least in part, on the target WL identifiers.

In some examples, WL control logic 214 includes WL switch circuitry 220 and sense circuitry 222. WL control logic 214 may be configured to receive target WL address (es) from memory partition controller logic 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215a, to WL select bias voltage to select the respective WL 215a. For example, WL switch circuitry 220 may include a plurality of transistors.

According to some examples, BL control logic 216 includes BL switch circuitry 224. BL control logic 216 may include sense circuitry, e.g., sense circuitry 222. BL control logic 216 may be configured to select one or more BLs for reading and/or writing operations. BL control logic 216 may be configured to select a target BL by coupling a BL select bias voltage (VPP) to the target BL. For example, VPP may have a value of 5.0 volts. BL control logic 216 may be configured to deselect a BL by decoupling the target BL from the BL select bias voltage and/or by coupling a BL deselect bias voltage to the BL. BL switch circuitry 224 is similar to WL switch circuitry 220 except BL switch circuitry 224 is configured to couple the BL select bias voltage to a target BL.

In some examples, sense circuitry 222 may be configured to detect presence or absence of a snap-back event during a sense interval (t-sense), e.g., during a read operation. For these examples, sense circuitry 222 may be configured to provide a logic level output related to the result of the read operation to, e.g., memory partition controller logic 210. For example, a logic level corresponding to a logic one may be output if a snap-back is detected and a logic level corresponding to a logic zero may be output if a snap-back is not detected. For example, in response to a signal from memory partition controller logic 210, WL control logic 214 and BL control logic 216 may be configured to select a target memory cell, e.g. memory cell 207, for a read operation by coupling WL 215a to WL select bias voltage and BL 217a to BL select bias voltage. One or both of sense circuitries 222 may then be configured to monitor WL 215a and/or BL 217a for a sense interval (t-sense) in order to determine whether or not a snap-back event occurs. If a sense circuitry 222 detects a snap-back event, then memory cell 207 may be in a SET state (e.g., logic level 1). If a sense circuitry 222 does not detect a snap-back event in the sense interval, then memory cell 207 may be in a RESET state (e.g., logic level 0). Thus, WL control logic 214 and/or BL control logic 216 may be configured to select a target memory cell for a read operation, initiate the read operation, monitor the selected memory cell for a snap-back event in a sense interval and provide the result of what was sensed to, e.g., memory partition controller logic 210.

According to some examples, sense circuitry 222 may include a word-line load connected to a word-line electrode to convert a current on the word-line electrode to a voltage that is a first input to a voltage comparator (i.e., sense amp) of the sense circuitry. An equivalent word-line load may be connected to a reference current to provide a voltage that is a second input to the voltage comparator. When a particular word-line and bit-line are selected in the array, the word-line load on the word-line electrode may convert the current on the selected bit-line to a voltage. In some examples, leakage components of the current can be mitigated by respectively selecting a bias for all other unselected word-lines and bit-lines that reduces or minimizes leakage. Capacitive components of the current can be mitigated by allowing sufficient time for the capacitive components to dissipate. The current that is converted to the first input to the voltage comparator may correspond with the current of the target memory cell. The reference current may be selected such that the current of the target memory cell is lower than the reference current before snap-back of the target or selected memory cell and higher than the reference current after snap-back of the selected memory cell. In this manner, an output of the voltage comparator may be indicative of a state of the selected memory cell. A latch may be coupled to the output of the voltage comparator to store the output of the read operation.

Figure 3:
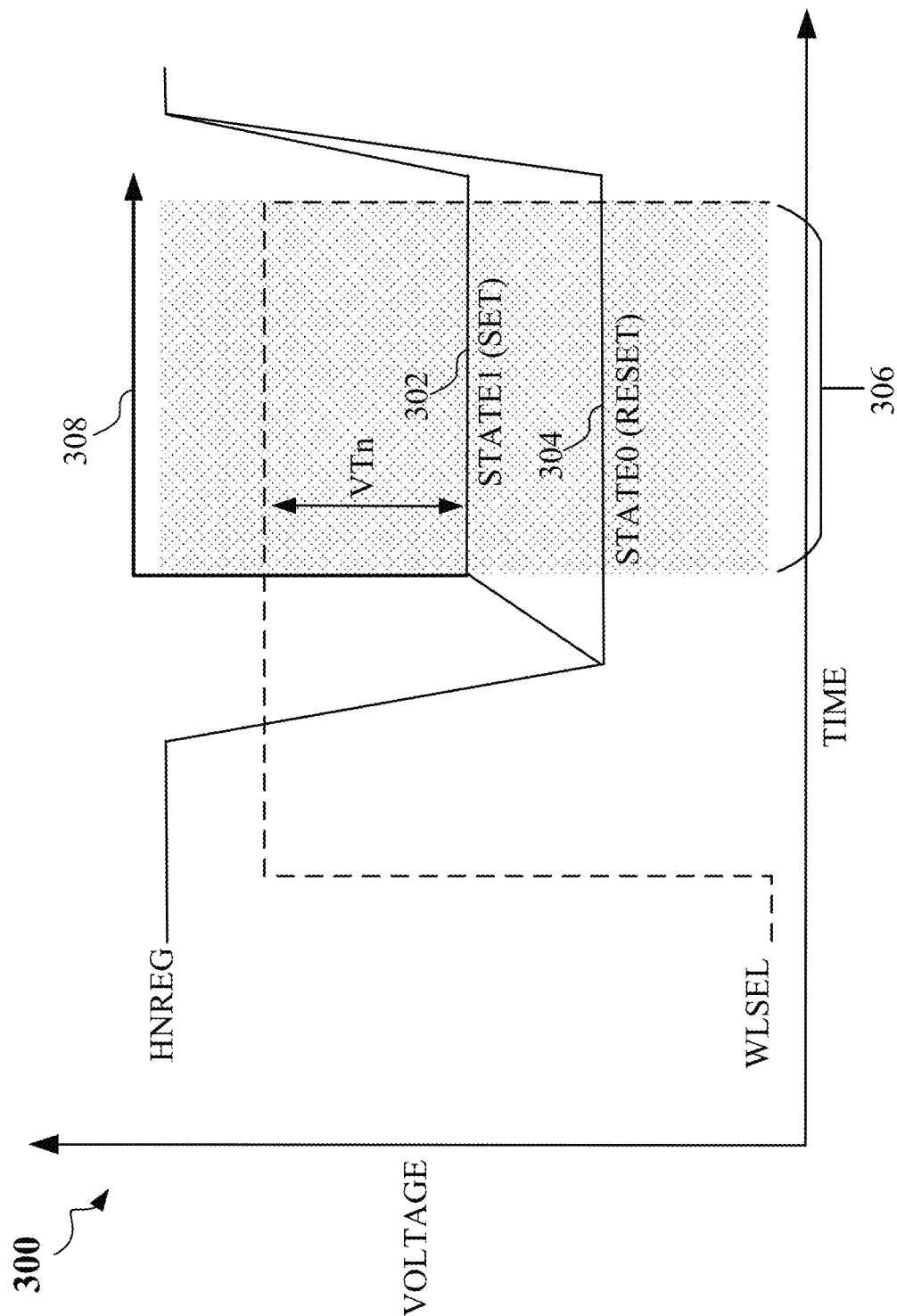
FIG. 3 illustrate an example graph.

FIG. 3 illustrates an example graph 300. In some example, graph 300 depicts a voltage profile and timing for various nodes of a memory array during a read operation, in accordance with some examples. During a read operation, a word line select (WLSEL) node (e.g., the WLSEL node of FIG. 5) may be biased with a voltage to turn on a transistor (e.g., transistor 504 of FIG. 5) and build up a voltage bias across a storage element of a 3D cross-point memory cell (e.g., 3D cross-point memory cell 502 of FIG. 5). A voltage of HNREG node (e.g., HNREG node of FIG. 5) may drop initially and then rise when the storage element turns on ("snapped") if the storage element is in a crystalline state, as can be seen at 302. A voltage of the WL (i.e., V(WL)) at the storage element of the memory cell may also go down and otherwise follow the HNREG and a voltage of the BL (i.e., V(BL)) at the storage element of the memory cell may be pulled up such that V(BL)-V(WL) is equal to a total bias on the storage element of the memory cell, which may be referred to as a demarcation read voltage (VDM) that is applied during the read operation. However, if the storage element is in an amorphous state, the voltage of the HNREG node may stay low until the HNREG node is in an off state and the voltage rises again to an initial voltage, as can be seen at 304. In some embodiments, an applied voltage bias such as the VDM may be high enough to only turn on a storage element in the crystalline state during a read pulse. The storage element in the crystalline state may have a lower threshold voltage (Vt) than a storage element in an amorphous state. In some examples, the VDM may be supplied through negative and/or positive regulated nodes. For example, the bit-line electrode of the selected 3D cross-point memory cell may be a positive regulated node and the word-line electrode coupled to the selected 3D cross-point memory cell (which may function as HNREG node, in some embodiments) may supply the voltage bias for VDM.

According to some examples, a sense of a state of a 3D cross-point memory cell may be performed when the storage element of the 3D cross-point memory cell that is in the crystalline state turns on at 302 (e.g., in the shaded region 306 or during the time indicated by arrow 308) before the storage element turns off, which may make latency independent of shutoff. Sensing may be performed to determine whether the storage element is in the crystalline state (e.g., at 302) or the amorphous state (e.g., at 304). Sense circuitry may determine whether the storage element is in the crystalline state or the amorphous state based on a measured voltage of the HNREG node. A sense margin may be substantially fixed irrespective of background leakage, which may increase in robustness of the read operation and prevent erroneous detection of STATE0 (RESET) bits being read as STATE1 (SET). For example, the sense margin may be determined by a threshold voltage of a WLSEL NMOS transistor (e.g., transistor 504 of FIG. 5). Voltage VTn may represent a difference between the WLSEL node and the HNREG node when the storage element in the crystalline state turns on at 302 (e.g., in the shaded region 306). That is, in some examples, a voltage of the HNREG node may correspond with a voltage of the WLSEL node minus the voltage VTn. In some examples, a voltage of the HNREG node when the storage element is in the amorphous state may correspond with a voltage of a WLVDM node. In a particular embodiment, the voltage of the WLVDM node may be a negative bias voltage applied to the WL through a negative regulator. In one embodiment, WLVDM may have a nominal capacity of −3.6 Volts.

As described earlier, during a read operation, a suitable voltage bias may be applied across the storage element of a selected 3D cross-point memory cell to build a demarcation voltage (VDM). This may result in a snap-back event across the storage element if the snap-back voltage (Vth) of the selected 3D cross-point memory cell is less than VDM and result in a transfer of charge between the BL and WL through the 3D cross-point memory cell. Depending on the conditions, this snap-back discharge event may be accompanied by a read disturb occurrence to the storage element. For example, the storage element may be weakly programmed or disturbed due to the snap-back discharge effect during the read operation.

Figure 4:
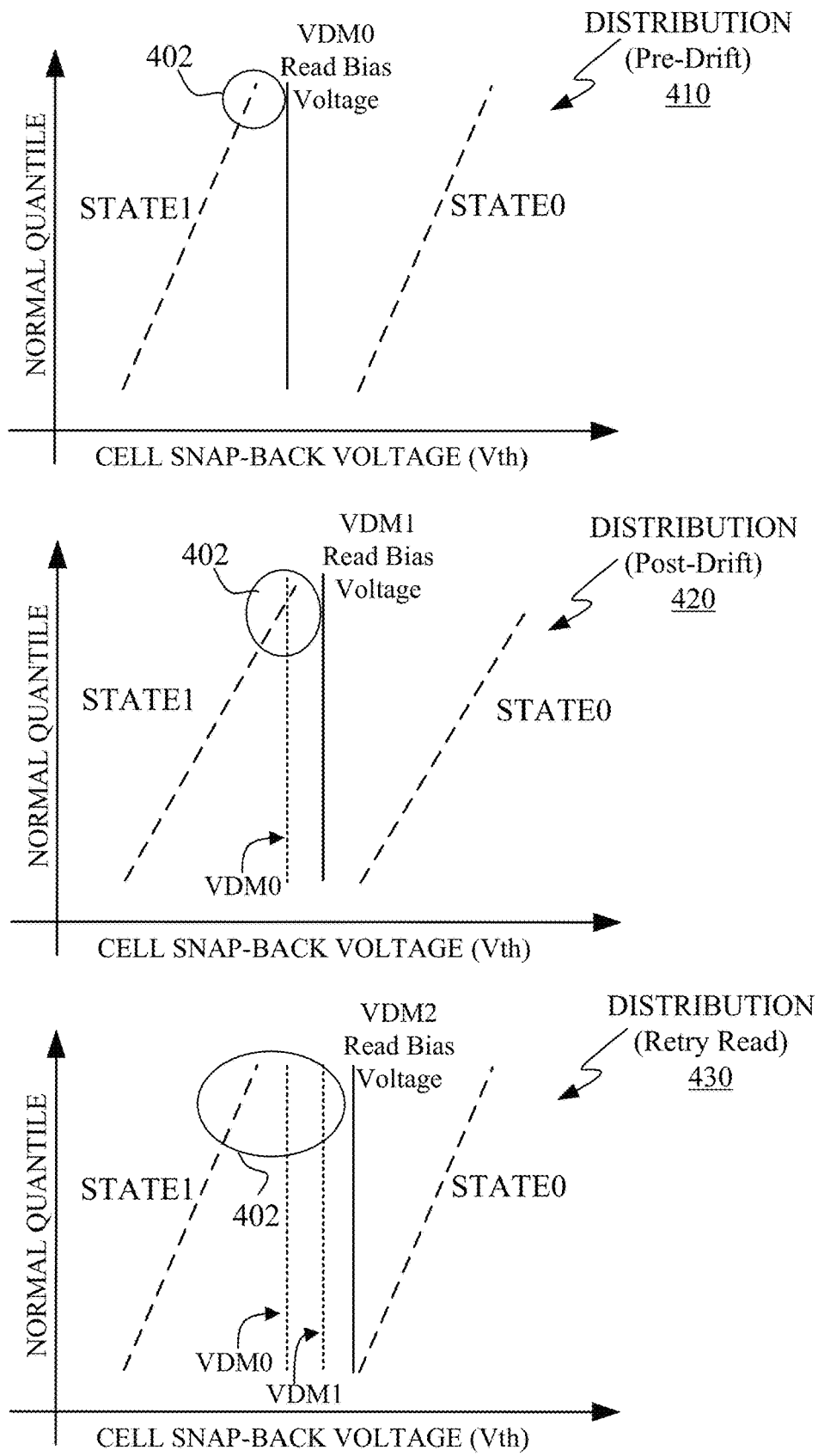
FIG. 4 illustrates example distributions for memory cells.

FIG. 4 illustrates example distributions for memory cells. In some examples, as shown in FIG. 4, the distributions may include a distribution 410 (Pre-Drift), a distribution 420 (Post-Drift), and a distribution 430 (Retry-Read). For these examples, the illustrated distributions may be example set distributions (State1) for 3D cross-point memory cells having storage elements that include phase change memory. Also, the illustrated distributions may represent examples of different distributions of 3D cross-point memory snap-back voltages. Each of the distributions separately represent example normal quantiles of 3D cross-point memory cells on a vertical axis and storage element snap-back voltages (Vth) on a horizontal axis. Also, for each of these example distributions, separate demarcation read voltages such as VDM0, VDM1, or VDM2 are shown that may be used to distinguish storage elements of 3D cross-point memory cells as being in a crystalline state (State1) from storage elements of 3D cross-point memory cells in an amorphous state (State0).

According to some examples, distribution 410 shows a case where there is a delineation at a demarcation read voltage of VDM0 for storage elements of 3D cross-point memory cells in the crystalline state (STATE1) and the amorphous state (STATE0). For these examples, distribution 410 may be representative of a critical or first time interval since a previous write and/or read operation to a given 3D cross-point memory cell. The critical or first time interval, for example, may be characterized as "pre-drift" via which the given distribution for the crystalline state does not move substantially towards the demarcation read voltage of VDM0. In some examples, the critical or first time interval may be approximately 3 seconds. Examples are not limited to critical or first time intervals of approximately 3 seconds. Also, for example distribution 410, storage elements of 3D cross-point memory cells 402 at an upper end of the distribution for STATE1 that are in the crystalline state may be properly read as being in the crystalline state if a critical or first time interval since a previous read and/or write operation has not been exceeded. As described more below, use of the lower demarcation read voltage of VDM0 may limit or reduce read disturb events but may increase a likelihood of I-hold problems that may lead to an inability to keep a selected 3D cross-point memory cell in a conductive ON state during a read operation. Also as described more below, t-sense may be reduced to a shorter time interval to mitigate these types of I-hold problems.

In some examples, distribution 420 shows a case where there is a delineation at a higher demarcation read voltage of VDM1 compared to the demarcation read voltage of VDM0 for storage elements of 3D cross-point memory cells in the crystalline state (STATE1) and the amorphous state (STATE0). For these examples, distribution 420 may be representative of a distribution at a second time interval that exceeds the critical or first time interval (e.g., >3 seconds) since a previous write and/or read operation to a given 3D cross-point memory cell. The second time interval, for example, may be characterized as "post-drift" via which a significant portion of a given distribution for the crystalline state drifts to the right and past a demarcation read voltage of VDM0. Therefore, storage elements of 3D cross-point memory cells 402 for distribution 420 at an upper end of the distribution for STATE1 that are in the crystalline state are more likely to be properly read as being in the crystalline state if the critical time interval since a previous read and/or write operation has been exceeded.

In some examples, storage elements of 3D cross-point memory cells 402 at the upper end of the distribution in the crystalline state for distribution 420 may be at a higher risk of being disturbed above the demarcation read voltage of VDM1 due to the higher voltage being used compared to the demarcation read voltage of VDM0 for a read operation. Being disturbed above the demarcation read voltage of VDM1 may lead to a read disturb event, and at least some storage elements of 3D cross-point memory cells 402 may be erroneously set to the amorphous state (STATE0) due to the read disturb event (e.g., note that the circle representing storage elements of 3D cross-point memory cells 402 is larger for distribution 420 compared to distribution 410). As described more below, a voltage level to use for the demarcation read voltage of VDM1 during a read operation may cause a selection current (I-sel) to be generated to sense a state of storage elements to be set such that I-sel almost matches a growth current (I-growth) generated by a slightly higher bias voltage (compared to the demarcation read voltage of VDM1) to set-back the storage elements of 3D cross-point memory cells 402 that experienced the read disturb event. For example, the slightly higher (growth) bias voltage is applied to generate I-growth to set-back the storage elements of 3D cross-point memory cells 402 when the storage elements in the crystalline state turn on at 302 as shown in FIG. 3 (e.g., in the shaded region 306).

According to some examples, distribution 430 shows a case where there is a delineation at an even higher demarcation read voltage of VDM2 compared to both the demarcation read voltages of VDM0 and of VDM1 for storage elements of 3D cross-point memory cells in the crystalline state (STATE1) and the amorphous state (STATE0). For these examples, distribution 430 may be similar to distribution 410 as a previous read operation to a given 3D cross-point memory cell may have been completed within at least the last 3 seconds. For example, a read error during the previous read operation resulted in a retry-read operation that occurs within the critical time interval. The retry-read operation may be responsive to an ECC scheme that may require a higher read bias. Although examples are not limited to retry-reads occurring within the critical time interval.

In some examples, storage elements of 3D cross-point memory cells 402 at the upper end of the distribution in the crystalline state for distribution 430 may be at a risk of being disturbed above the demarcation read voltage of VDM2 due to a higher voltage being used compared to both the demarcation read voltages of VDM0 and of VDM1 for a read operation. Being disturbed above the demarcation read voltage of VDM2 may lead to a read disturb event for a retry-read, and at least some storage elements of 3D cross-point memory cells 402 may be erroneously set to the amorphous state (STATE0) due to the read disturb event (e.g., note that the circle representing storage elements of 3D cross-point memory cells 402 is larger for distribution 430 compared to distributions 410 or 420). As described more below, a voltage level to use for the demarcation read voltage of VDM2 during a retry read operation may cause I-sel to be generated to sense a state of storage elements to be set such that I-sel matches a growth current (I-growth) generated by a growth bias voltage to set-back the storage elements of 3D cross-point memory cells 402 that experienced the read disturb event. Also, as described more below, a longer or expanded time interval for t-sense may be used to address possible signal to noise issues during a sense of storage element states caused by the relatively higher read demarcation read voltage of VDM2.

Figure 5:
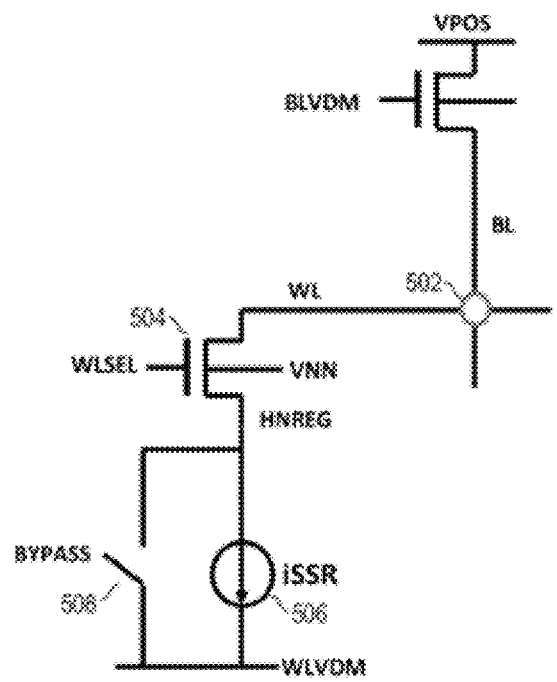
FIG. 5 illustrates example circuitry.

FIG. 5 illustrates example circuitry 500. In some examples, circuitry 500 may be associated with a 3D cross-point memory cell 502 of a 3D cross-point device. 3D cross-point memory cell 502 may have similar characteristics to 3D cross-point memory cell 107 described above for FIG. 1. In various examples, 3D cross-point memory cell 502 may include a phase change material and a cell selector such as an ovonic threshold switch (OTS) coupled with a word-line (WL) node and a bit-line (BL) node, as depicted in FIG. 5.

According to some examples, one or more transistors and/or capacitors may be coupled with the WL node. For example, as shown in FIG. 5, a transistor 504 may be coupled with the WL node. A negative regulated supply node (HNREG node) may be coupled with transistor 504. The HNREG node may be used as a sense node in some examples (e.g., the HNREG node may be used as an input for a sense amp comparator).

In some examples, 3D cross-point memory cell 502 may be coupled to a current-ting circuitry 506. For these examples, current-limiting circuitry 506 may provide or control (e.g., limit) a first level of a current through 3D cross-point memory cell 502 during a sense time interval. Current-limiting circuitry 506, in some examples, may include a current mirror circuit to generate a mirror current (I-mirror) during the sense interval. Current-limiting circuitry 506 may include a transistor gate that is configured to limit a current of the word-line electrode to a maximum current level. For example, the transistor may be an n-type transistor having a gate that is controlled to an analog level such that the transistor delivers up to a maximum desired current. Current-limiting circuitry 506 may be enabled by applying a gate voltage to the transistor.

According to some examples, the current provided by current-limiting circuitry 506 may not be capable of generating an optimal set-back current for a 3D cross-point memory cell following a sense interval. For these examples, current-limiting circuitry 506 may be bypassed using bypass switch 508. Bypass switch 508 may be implemented as an NMOS transistor with a logic level control signal. By bypassing current-limiting circuitry 506 during set-back, a separate set-back current may be applied through 3D cross-point memory cell 502 during a set-back or growth interval. Closing a switch 508 results in a grounding of the HNREG node to WLVDM. Thus, taking current-limiting circuitry 506 out of the signal path. When switch 508 is closed, the current is limited by the Vgs drop (the voltage at WLSEL minus the voltage at HNREG) across the select device (e.g., transistor 504). Accordingly, the higher current may be adjustable by varying the voltage applied to WLSEL (as this will change the Vgs drop) (e.g., an optimal voltage could be determined by test circuitry after fabrication during a tuning process).

In some examples, once the desired pulse width at the higher current (i.e., the growth current (I-growth)) is reached, the bias voltage to generate I-growth may be turned off when the voltage of the WLSEL node goes back down. In some example, the bypass operation ends (and current-limiting circuitry 506 is then included in the path for a period of time) prior to the WLSEL node going back down, such that a non-abrupt stepdown from a high step-back current may be achieved.

FIG. 6 illustrates example read pulse profiles 600. In some examples, as shown in FIG. 6, read pulse profiles 600 include a first profile 610 (longer t-sense) and a second profile 620 (shorter t-sense). For these examples, the two different read pulse profiles shown in FIG. 6 are associated with a first demarcation read voltage of VDM0. The read pulse profiles shown in FIG. 6, for example, may be generated by circuitry 500 and the shaded portions of each respective profile may indicate a read pulse current profile through a 3D cross-point memory cell 502 during a read operation having different intervals for sensing 3D cross-point memory cell 502's state (t-sense) and also having different intervals for an integrated set-back that applies a high bias set-back voltage to generate an integrated set-back current (I-growth). For example, during a read operation with integrated setback, the transistor 504 may control snap-back discharge (e.g., selection spike 612 or 622) during a read pulse and a path through switch 508 and/or current-limiting circuitry (e.g., 506) may provide/control current to generate I-growth to cause 3D cross-point memory cell 502 to be set-back to a crystalline state.

According to some examples, profiles 610 and 620 show comparative examples of what may occur if a relatively low demarcation read voltage of VDM0 is used with a first time interval for t-sense 614 that is longer than a second time interval for t-sense 624. For these examples, I-hold 605 may represent a needed current to keep 3D cross-point memory cell 502 in a conductive ON state during at least the t-sense portion of a read operation. In some examples, as shown in FIG. 6 for profile 610, for the longer t-sense 614, a low read bias caused by VDM0 may prevent delivery of a desired selection current that stays above I-hold 605 for all of t-sense 614. Although the low read bias caused by VDM0 may serve to limit a maximum current that can flow through 3D cross-point memory cell 502, profile 610 shows how an initial current (I-sel) during t-sense 614 is lower than current provided by current-limiting circuitry (I-mirror) following selection spike 612. As shown by the shaded region of profile 610, the lower current through 3D cross-point memory cell 502 may drop below I-hold 605 before the end of the first time interval for t-sense 614. As a result of dropping below I-hold 605, undesirable cell oscillations may cause a reading error. These cell oscillations may also cause additional read disturb to a storage element included in 3D cross-point memory cell 502.

In some examples, profile 620 shows how it is possible to have effectively higher current at selection of 3D cross-point memory cell 502 that results in an I-sel approximately equal to I-mirror following selection spike 622 by applying the shorter second time interval t-sense 624. The shorter second time interval t-sense 624 may take advantage of extra parasitic displacement current through 3D cross-point memory cell 502. Also, since the demarcation read voltage of VDM0 may be applied during a pre-drift time period following a previous read and/or write operation to 3D cross-point memory cell 502, there may be no benefit in having a longer time interval t-sense. As shown by the shaded region of profile 620, a lowest point of the current flowing through 3D cross-point memory cell 502 stays above I-hold 605 during t-sense 624. Thus, undesirable cell oscillations are avoided.

FIG. 7 illustrates example read pulse profiles 700. In some examples, as shown in FIG. 7, read pulse profiles 700 include a first profile 710 (lower I-sel) and a second profile 720 (higher I-sel). For these examples, the two different read pulse profiles shown in FIG. 7 are associated with a second demarcation read voltage of VDM1. The read pulse profiles shown in FIG. 7, for example, may be generated by circuitry 500 and the shaded portions of each respective profile may indicate a read pulse current profile through a 3D cross-point memory cell 502 during a read operation having different currents for I-sel during t-sense followed by a high bias set-back voltage to generate I-growth.

According to some examples, VDM1 is at a higher demarcation read voltage compared to the demarcation read voltage of VDM0. For these examples, the higher demarcation read voltage may eliminate I-hold issues as can be seen by I-sel for both profiles remaining above I-hold 705. However, when the demarcation read voltage of VDM1 is applied post-drift or after a critical time period (e.g., >3 seconds after a read and/or write operation), the current for I-sel may be pushed higher to be as close as possible to the current for I-growth following a selection spike. Profile 720 shows the higher I-sel read pulse profile following selection spike 722 compared to I-sel for profile 710 following selection spike 712. Also, there is no need to reduce t-sense between the two profiles. Rather, it may be beneficial to keep t-sense 724 as long as possible (but still meet read latency requirements) to maximize time spent at a highest possible current to mitigate read-disturb. In some examples, for longer time periods since a previous read and/or write operation (higher drift times), a higher voltage threshold (Vt) may be expected and as a result a higher incidence of read-disturb is possible. Keeping t-sense 724 as long as possible may mitigate the higher incidence of read-disturb.

Figure 8:
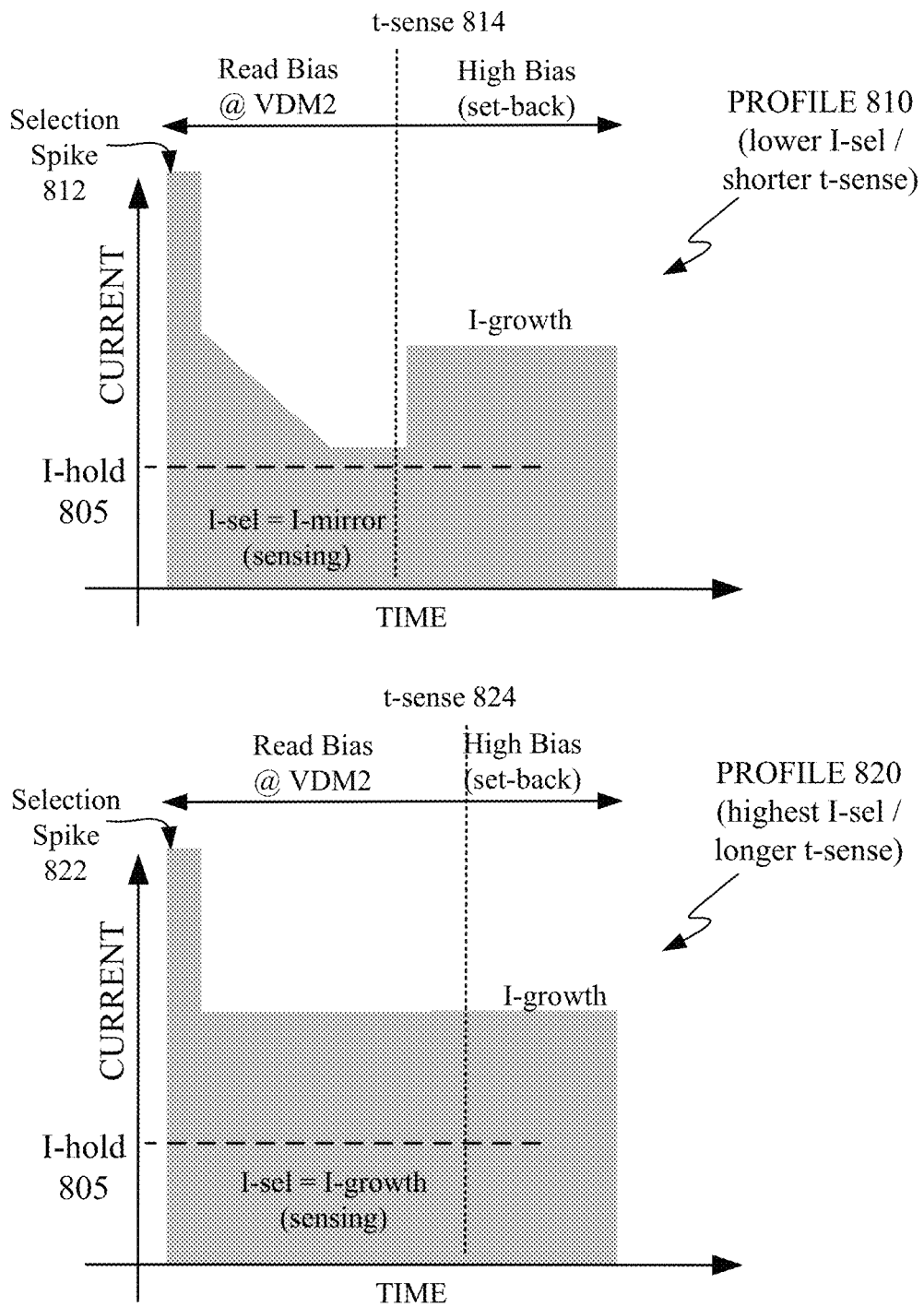
FIG. 8 illustrates an example third current profile during a read operation.

FIG. 8 illustrates example read pulse profiles 800. In some examples, as shown in FIG. 8, read pulse profiles 800 include a first profile 810 (lower I-sel/shorter t-sense) and a second profile 720 (higher I-sel/longer t-sense). For these examples, the two different read pulse profiles shown in FIG. 8 are associated with a third demarcation read voltage of VDM2. The read pulse profiles shown in FIG. 8, for example, may be generated by circuitry 500 and the shaded portions of each respective profile may indicate a read pulse current profile through a 3D cross-point memory cell 502 during a read operation having different currents for I-sel during different time intervals for t-sense followed by a high bias set-back voltage to generate I-growth.

According to some examples, the demarcation read voltage of VDM2 is at a higher or highest demarcation read voltage compared to the demarcation read voltages of VDM1 and of VDM0. Similar to the demarcation read voltage of VDM1, the higher demarcation read voltage of VDM2 eliminates I-hold issues as can be seen by I-sel for both profiles remaining above I-hold 805. For these examples, a read-retry operation may be managed by error correction control (ECC) logic implemented by a controller for a memory/storage device (e.g., controller 118 of memory/storage device 106). Since the read-retry operation is managed by ECC logic, it may be possible to expand t-sense and maximize a current for I-sel to match a current for I-growth. Therefore, as shown in FIG. 8, profile 820 indicates a current for I-sel that matches or is equal to a current for I-growth following selection spike 822 over a first time interval t-sense 824. Comparatively, profile 810 indicates that a current for I-sel only matches a current for I-mirror over a second, shorter time interval for t-sense 814. Profile 820 may be preferred to mitigate a higher possibility of read-disturb to 3D cross-point memory cell 502 during a read-retry operation due to the higher demarcation read voltage of VDM2.

In some examples, although not shown in FIG. 8, rather than expanding a t-sense time, an I-growth time interval may be expanded to mitigate read-disturb and t-sense may be kept to a similar time interval as shown in profile 810. For these examples, ECC logic may have a flexibility to expand I-growth (e.g., extra occupancy time) to mitigate read-disturb caused by the higher demarcation read voltage of VDM2. The ECC logic may also expand both t-sense and I-growth to mitigate read-disturb.

Figure 9:
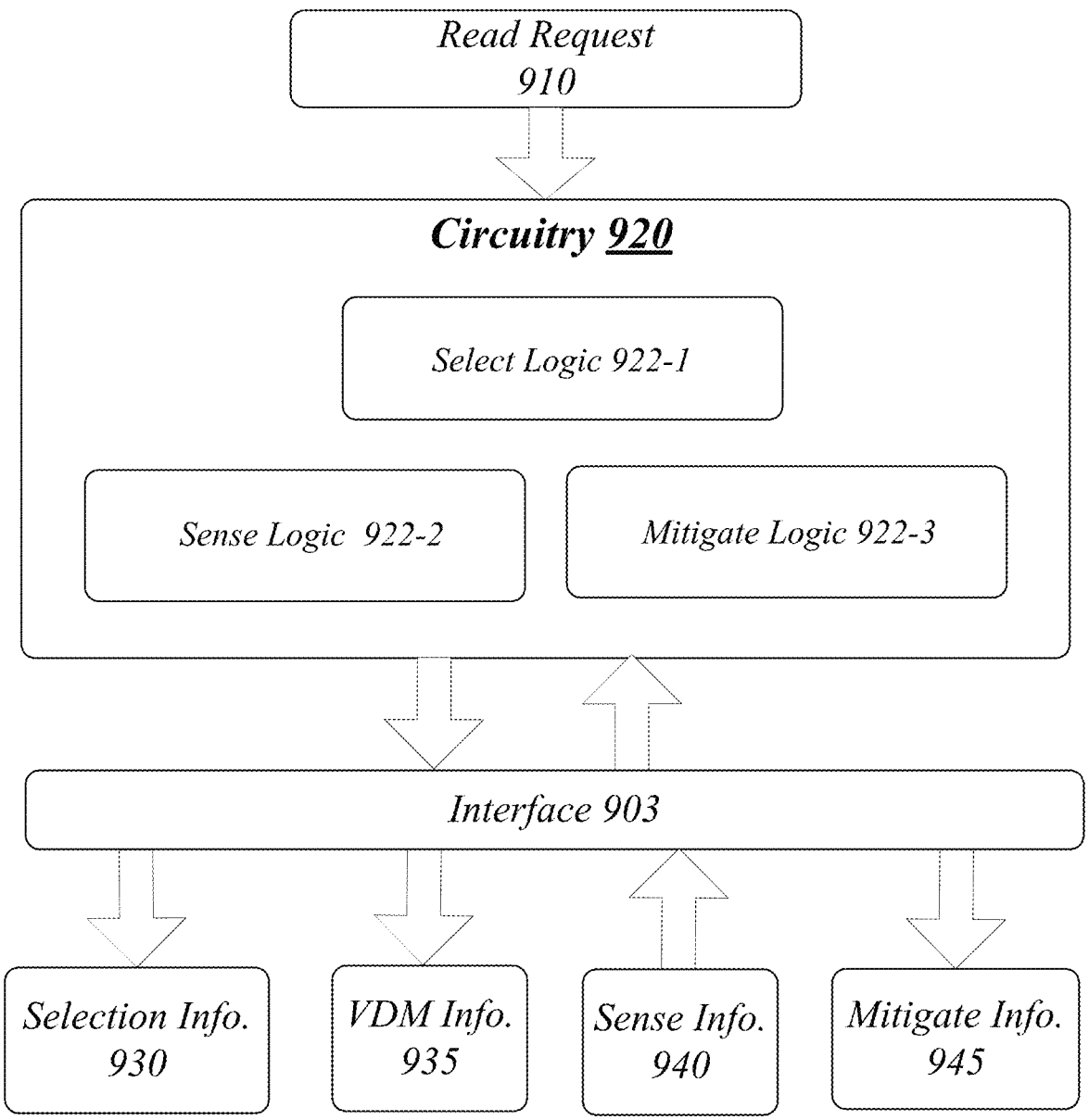
FIG. 9 illustrates an example block diagram for an apparatus.

FIG. 9 illustrates an example block diagram for an apparatus 900. Although apparatus 900 shown in FIG. 9 has a limited number of elements in a certain topology, it may be appreciated that the apparatus 900 may include more or less elements in alternate topologies as desired for a given implementation.

The apparatus 900 may be supported by circuitry 920 and apparatus 900 may be a controller maintained at a memory device or with a memory system coupled with a memory array of the memory device through an interface 903 that may also be used to access the memory cells (e.g., via read or write operations). The memory device may be coupled with or included in a host computing platform. Circuitry 920 may be arranged to execute one or more software or firmware implemented logic, components or modules 922-*a* (e.g., implemented, at least in part, by a controller of a memory device). It is worthy to note that "a" and "b" and "c" and similar designators as used herein are intended to be variables representing any positive integer. Thus, for example, if an implementation sets a value for a=3, then a complete set of software or firmware for logic, components or modules 922-*a* may include logic 922-1, 922-2 or 922-3. Also, at least a portion of "logic" may be software/firmware stored in computer-readable media, or may be implemented, at least in part in hardware and although the logic is shown in FIG. 9 as discrete boxes, this does not limit logic to storage in distinct computer-readable media components (e.g., a separate memory, etc.) or implementation by distinct hardware components (e.g., separate application-specific integrated circuits (ASICs) or field programmable gate arrays (FPGAs)).

According to some examples, circuitry 920 may include a processor or processor circuitry. The processor or processor circuitry can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples, circuitry 920 may also include one or more ASICs or FPGAs and, in some examples, at least some logic 922-*a* may be implemented as hardware elements of these ASICs or FPGAs.

According to some examples, apparatus 900 may include a select logic 922-1. Select logic 922-1 may be a logic and/or feature executed by circuitry 920 to select a memory cell from among memory cells of a memory array to implement a read operation through interface 903 that may be configured to access the memory cells of the memory array. For these examples, select logic 922-1 may select the memory cell responsive to a read request included in read request 910. Read request 910, for example, may have been sent from a host CPU (e.g., CPU 102). Also, selection 930 information may be routed through interface 903 and may include address information used to select the memory cell for a read operation.

In some examples, apparatus 900 may also include a sense logic 922-2. Sense logic 922-2 may be a logic and/or feature executed by circuitry 920 to apply, to the memory cell, one of a first VDM, a second VDM or a third VDM for a respective first, second or third time interval to sense a state of a resistive storage element of the memory cell. For these examples, sense logic 922-2 may route VDM information 935 through interface 903 to apply the first, second or third VDM for the respective first, second or third time interval in order to sense a state of a resistive storage element of the memory cell. Also, sense logic 922-2 may receive sense information 940 that may indicate a sensed state of the memory cell while the first, second or third VDM was applied.

According to some examples, apparatus 900 may also include an mitigate logic 922-3. Mitigate logic 922-3 may be a logic and/or feature executed by circuitry 920 to apply, to the memory cell, a bias voltage following the respective first, second or third time interval to mitigate read disturb to the resistive storage element incurred while the first, second or third VDM was applied to the memory cell. For these examples, mitigate information 945 may indicate what bias voltage is needed to cause a current (e.g., I-growth) to mitigate read disturb to the resistive storage element.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 10 illustrates an example of a logic flow 1000. Logic flow 1000 may be representative of some or all of the operations executed by one or more logic, features, or devices described herein, such as apparatus 900. More particularly, logic flow 1000 may be implemented by one or more of select logic 922-1, sense logic 922-2 or mitigate logic 922-3.

According to some examples, logic flow 1000 at block 1002 may select a memory cell included in a memory array. For these examples, select logic 922-1 may select the memory cell.

In some examples, logic flow 1000 at block 1004 may apply, to the memory cell, one of a first VDM, a second VDM or a third VDM for a respective first, second or third time interval to sense a state of a resistive storage element of the memory cell. For these examples, sense logic 922-2 may apply the first, second or third VDM for the respective first, second or third time interval to sense the state of the resistive storage element.

According to some examples, logic flow 1000 at block 1006 may apply, to the memory cell, a bias voltage following the respective first, second or third time interval to mitigate read disturb to the resistive storage element incurred while the first, second or third VDM was applied to the memory cell. For these examples, mitigate logic 922-3 may apply the bias to mitigate read disturb to the resistive storage element.

FIG. 11 illustrates an example of a first storage medium. As shown in FIG. 11, the first storage medium includes a storage medium 1100. The storage medium 1100 may comprise an article of manufacture. In some examples, storage medium 1100 may include any non-transitory computer readable medium or machine readable medium, such as an optical, magnetic or semiconductor storage. Storage medium 1100 may store various types of computer executable instructions, such as instructions to implement logic flow 1000. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 12:
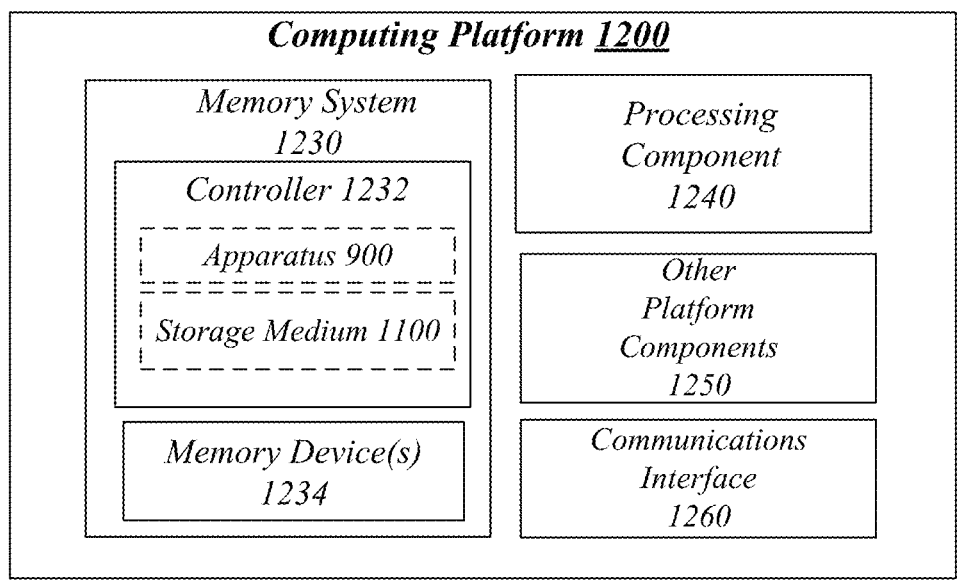
FIG. 12 illustrates an example computing platform.

FIG. 12 illustrates an example computing platform 1200. In some examples, as shown in FIG. 12, computing platform 1200 may include a memory system 1230, a processing component 1240, other platform components 1250 or a communications interface 1260. According to some examples, computing platform 1200 may be implemented in a computing device.

According to some examples, memory system 1230 may include a controller 1232 and memory devices(s) 1234. For these examples, logic and/or features resident at or located at controller 1232 may execute at least some processing operations or logic for apparatus 900 and may include storage media that includes storage medium 1100. Also, memory device(s) 1234 may include similar types of non-volatile memory (not shown) that are described above for system 100, array 126, or array portion 400 shown in FIGS. 1-4. In some examples, controller 1232 may be part of a same die with memory device(s) 1234. In other examples, controller 1232 and memory device(s) 1234 may be located on a same die and located on a same substrate or die with a processor (e.g., included in processing component 1240). In yet other examples, controller 1232 may be in a separate die or integrated circuit coupled with memory device(s) 1234.

According to some examples, processing component 1240 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, programmable logic devices (PLD), digital signal processors (DSP), FPGA/programmable logic, memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1250 may include common computing elements, such as one or more processors, multi-core processors, co-processors, memory units, chipsets, controllers, peripherals, interfaces, oscillators, timing devices, video cards, audio cards, multimedia I/O components (e.g., digital displays), power supplies, and so forth. Examples of memory units associated with either other platform components 1250 or memory system 1230 may include without limitation, various types of computer readable and machine readable storage media in the form of one or more higher speed memory units, such as read-only memory (ROM), RAM, DRAM, DDR DRAM, synchronous DRAM (SDRAM), DDR SDRAM, SRAM, programmable ROM (PROM), EPROM, EEPROM, flash memory, ferroelectric memory, SONOS memory, polymer memory such as ferroelectric polymer memory, nanowire, FeTRAM or FeRAM, ovonic memory, phase change memory, memristors, STT-MRAM, magnetic or optical cards, and any other type of storage media suitable for storing information.

In some examples, communications interface 1260 may include logic and/or features to support a communication interface. For these examples, communications interface 1260 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification. Network communications may occur through a network interface via use of communication protocols or standards such as those described in one or more Ethernet standards promulgated by the IEEE. For example, one such Ethernet standard may include IEEE 802.3-2018, Carrier sense Multiple access with Collision Detection (CSMA/CD) Access Method and Physical Layer Specifications, Published in August 2018 (the "IEEE 802.3-2018 specification").

Computing platform 1200 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 1200 described herein, may be included or omitted in various embodiments of computing platform 1200, as suitably desired.

The components and features of computing platform 1200 may be implemented using any combination of discrete circuitry, ASICs, logic gates and/or single chip architectures. Further, the features of computing platform 1200 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

Although not depicted, any system can include and use a power supply such as but not limited to a battery, AC-DC converter at least to receive alternating current and supply direct current, renewable energy source (e.g., solar power or motion based power), or the like.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus comprising:
an interface to access memory cells of a memory array; and
a controller, the controller to include logic, at least a portion of which is implemented as hardware, the logic to:
select a memory cell from among the memory cells of the memory array to implement a read operation through the interface;
apply, to the memory cell, one of a first demarcation read voltage (VDM), a second VDM or a third VDM for a respective first, second or third time interval to sense a state of a resistive storage element of the memory cell; and
apply, to the memory cell, a bias voltage following the respective first, second or third time interval to mitigate read disturb to the resistive storage element incurred while the first, second or third VDM was applied to the memory cell.

2. The apparatus of claim 1, further comprising the logic to:
apply the first VDM for the first time interval based on selection of the memory cell within a given time interval from a previous read or write operation to the memory cell, the given time interval based on a drift of the resistive storage element that causes a higher voltage threshold to sense the state of the resistive storage element after the given time interval has been exceeded.

3. The apparatus of claim 2, the first time interval comprises a shortest time interval compared to the second and third time intervals.

4. The apparatus of claim 2, the first VDM comprises a lowest VDM compared to the second and the third VDM.

5. The apparatus of claim 1, further comprising the logic to:
apply the second VDM for the second time interval based on selection of the memory cell outside of a given time interval from a previous read or write operation to the memory cell, the given time interval based on a drift of the resistive storage element that causes a higher voltage threshold to sense the state of the resistive storage element after the given time interval has been exceeded.

6. The apparatus of claim 1, further comprising the logic to:
apply the third VDM for the third time interval based on selection of the memory cell responsive to a retry-read operation.

7. The apparatus of claim 6, comprising the third time interval comprises a longest time interval compared to the first and second time interval.

8. The apparatus of claim 6, the third VDM comprises a highest VDM compared to the first and the second VDM.

9. The apparatus of claim 8, further comprising the logic to:
apply the third VDM to cause a first current to flow through the memory cell during the third time interval, the first current to match a second current flowing through the memory cell while the bias voltage is applied.

10. The apparatus of claim 1, the memory cell comprising a 3-dimensional (3D) cross-point memory structure, wherein the resistive storage element includes phase change memory.

11. The apparatus of claim 1, comprising one or more of:
one or more processors communicatively coupled to the controller;
a network interface communicatively coupled to the apparatus;
a battery coupled to the apparatus; or
a display communicatively coupled to the apparatus.

12. A method comprising:
selecting a memory cell included in a memory array;
applying, to the memory cell, one of a first demarcation read voltage (VDM), a second VDM or a third VDM for a respective first, second or third time interval to sense a state of a resistive storage element of the memory cell; and
applying, to the memory cell, a bias voltage following the respective first, second or third time interval to mitigate read disturb to the resistive storage element incurred while the first, second or third VDM was applied to the memory cell.

13. The method of claim 12, comprising:
applying the first VDM for the first time interval based on the memory cell being selected within a given time interval from a previous read or write operation to the memory cell, the given time interval based on a drift of the resistive storage element that causes a higher voltage threshold to sense the state of the resistive storage element after the given time interval has been exceeded.

14. The method of claim 13, the first time interval comprises a shortest time interval compared to the second and third time intervals and the first VDM comprises a lowest VDM compared to the second and the third VDM.

15. The method of claim 12, comprising:
applying the second VDM for the second time interval based on the memory cell being selected outside of a given time interval from a previous read or write operation to the memory cell, the given time interval based on a drift of the resistive storage element that causes a higher voltage threshold to sense the state of the resistive storage element after the given time interval has been exceeded.

16. The method of claim 12, comprising:
applying the third VDM for the third time interval based on the memory cell being selected responsive to a retry-read operation, wherein the third time interval is a longest time interval compared to the first and second time interval and the third VDM is a highest VDM compared to the first and the second VDM; and
applying the third VDM to cause a first current to flow through the memory cell during the third time interval, the first current to match a second current flowing through the memory cell while the bias voltage is applied.

17. The method of claim 12, the memory cell comprising a 3-dimensional (3D) cross-point memory structure, wherein the resistive storage element includes phase change memory.

18. A system comprising:
a memory array;
an interface to access memory cells of the memory array; and
a controller coupled with the interface, the controller to include logic, at least a portion of which is implemented as hardware, the logic to:
  select a memory cell from among the memory cells of the memory array;
  apply, to the memory cell, one of a first demarcation read voltage (VDM), a second VDM or a third VDM for a respective first, second or third time interval to sense a state of a resistive storage element of the memory cell; and
  apply, to the memory cell, a bias voltage following the respective first, second or third time interval to mitigate read disturb to the resistive storage element incurred while the first, second or third VDM was applied to the memory cell.

19. The system of claim 18, further comprising the logic to:
apply the first VDM for the first time interval based on selection of the memory cell within a given time interval from a previous read or write operation to the memory cell, the given time interval based on a drift of the resistive storage element that causes a higher voltage threshold to sense the state of the resistive storage element after the given time interval has been exceeded, wherein, the first time interval comprises a shortest time interval compared to the second and third time intervals and the first VDM comprises a lowest VDM compared to the second and the third VDM.

20. The system of claim 19, further comprising the logic to:
apply the second VDM for the second time interval based on selection of the memory cell outside of a given time interval from a previous read or write operation to the memory cell, the given time interval based on a drift of the resistive storage element that causes a higher voltage threshold to sense the state of the resistive storage element after the given time interval has been exceeded.

21. The system of claim 19, further comprising the logic to:
apply the third VDM for the third time interval based on selection of the memory cell responsive to a retry-read operation, wherein the third time interval is a longest time interval compared to the first and second time interval and the third VDM is a highest VDM compared to the first and the second VDM.

22. The system of claim 21, further comprising the logic to:
apply the third VDM to cause a first current to flow through the memory cell during the third time interval, the first current to match a second current flowing through the memory cell while the bias voltage is applied.

23. The system of claim 18, the memory cell comprising a 3-dimensional (3D) cross-point memory structure, wherein the resistive storage element includes phase change memory.

* * * * *